United States Patent [19]

Weber et al.

[11] 4,015,615
[45] Apr. 5, 1977

[54] FLUID APPLICATION SYSTEM

[75] Inventors: Jorn-Olaf Christian Weber, Wappingers Falls; Carl Yakubowski, Hyde Park, both of N.Y.

[73] Assignee: International Business Machines Corporation, Armonk, N.Y.

[22] Filed: June 13, 1975

[21] Appl. No.: 586,769

[52] U.S. Cl. .............................. 134/196; 134/200; 134/201; 269/296
[51] Int. Cl.² .......................................... B08B 3/02
[58] Field of Search ............................ 134/88–89, 134/105, 107, 122 R, 122 P, 169 R, 171, 182–184, 193, 196–197, 200–201; 269/296

[56] References Cited
UNITED STATES PATENTS

| | | | |
|---|---|---|---|
| 1,114,591 | 10/1914 | De Laney | 134/200 UX |
| 3,404,845 | 10/1968 | Schmeling et al. | 134/182 X |
| 3,762,426 | 10/1973 | Yakubowski | 134/196 X |
| 3,765,431 | 10/1973 | Jannett et al. | 134/183 X |
| 3,851,758 | 12/1974 | Makhijani et al. | 134/169 R X |

*Primary Examiner*—Robert L. Bleutge
*Attorney, Agent, or Firm*—George O. Saile

[57] ABSTRACT

A fluid application system which is useful for the subjection of substantially planar objects to various fluids for cleaning, etching, photoresist developing and the like. The system includes a chamber which has at least one agitation mechanism. The agitation mechanism includes an orificed plate positioned on one side of one or more of the planar objects. Means are provided for moving the fluid through the orificed plate with a pulsating motion. The agitation mechanism can either be substantially within the chamber or form one or more of the sides of the chamber. The agitation mechanism includes in addition to the orificed plate, a pneumatic chamber, a fluid chamber, a flexible diaphragm between the pneumatic and fluid chambers, and a piston being movable within the agitation mechanism to force the fluid through the orificed plate with the pulsating motion.

6 Claims, 13 Drawing Figures

FLUID APPLICATION SYSTEM

BACKGROUND OF THE INVENTION

The invention relates to fluid application systems for subjecting substantially planar objects to fluids for cleaning, etching, developing of photoresist and the like.

DESCRIPTIION OF THE PRIOR ART

Automatically controlled wet processing of thin semiconductor wafers by immersing in various fluids, liquid and gases, has been used. These wafers are commonly a few mils in thickness and up to several inches in diameter. The semiconductor wafers are made of silicon, germanium or III-V semiconductor compounds and are extremely brittle and fragile. In the fabrication of semiconductor devices, a series of fluid applications involving cleaning, etching, photoresist development and so forth are important to these processes. Following the fabrication of semiconductor devices such as transistors, diodes and integrated circuits in the semiconductor wafer, the wafer is cut into many chips which each contain the desired transistor, diodes or integrated circuits. These chips are then mounted on typically a ceramic substrate and electrically and physically attached thereto. These resulting modules require cleaning procedures so as to remove residual solder fluxes and the like which remain on the module after the physical and electrical joining processes. Where the flip chip type of semiconductor joining technique is used such as described in the L. F. Miller U.S. Pat. No. 3,429,040, issued on Feb., 25, 1969, the cleaning of solder fluxes and the like which are between the semiconductor chip and the ceramic substrate is particularly difficult.

Workers in the semiconductor field have designed techniques for treating semiconductor wafers in automated systems. U.S. Pat. No. 3,489,608, to Bernard Jacobs, issued Jan. 13, 1970, describes an apparatus for chemically treating a plurality of semiconductor wafers. The wafers are placed on a carrier which rotates within a chamber. As the carrier rotates, liquid or gaseous chemicals are sprayed onto the wafers. The movement of the wafers relative to the spray brings about an intimate contact between the chemicals and the wafers to produce the desired chemical treatmemts.

U.S. Pat. No. 3,779,179, to Gertrude L. Thomas, issued Mar. 26, 1974, describes another technique for fluid treatment of semiconductor wafers. In one preferred embodiment a container is utilized to hold a quantity of the processing solution. A carrier holding a plurality of components is immersed in the processing solution to enable the desired treatment of the components. The processor has a plurality of apertures located below the components in the carrier tray when the tray is immersed in the processing solution. The plurality of apertures release a precisely controlled amount of gas into the processing solution below the components being processed to provide precisely controlled agitation of the solution in contact with the component to thereby effect the desired treatment.

U.S. Pat. No. 3,071,178 to M. S. Howeth, issued Jan. 1, 1963, describes an apparatus for the controlled etching of metal. This apparatus includes an autoclave wherein the etching or corrosion solution is applied therein by vapor form within an atmosphere, the temperature and pressure of which are controlled at their optimum values for the etching process.

U.S. Pat. No. 3,760,822 to Arthur Evans, issued Sept. 25, 1973, describes a machine for cleaning semiconductor wafers wherein the cleaning solvent is dispensed under pressure using nitrogen for this purpose. After dispensing the solvent, the solvent line is closed by a suitable valve and nitrogen alone is used to blow off to dry the wafers while they are spinning in a specifically designed semiconductor wafer holder. The wafer on each vacuum chuck is held thereto by the vacuum drawn through a pattern of grooves on the top surface of the chuck whereas the solvent and gas blow-off with respect to the wafer held on the particular chuck is dispensed from the underface of the vacuum chuck above the wafer in question.

SUMMARY OF THE PRESENT INVENTION

A fluid application system has been developed which includes a specifically designed agitation mechanism which allows the performance of the various fluid application techniques onto a plurality of stationary semiconductor wafers or modules in a standard carrier. The prior art techniques almost universally have required the movement of the objects to be treated as an important part of the treatment process. The present agitation mechanism is so efficient and effective that the movement of the objects is not required and therefore there is a reduced possibility for the injury to the objects being treated. Further, the agitation mechanism is positioned closely adjacent to the objects and since it does not take up a great deal of room, a series of these agitation mechanisms can be positioned one over the other with additional of the objects to be treated placed under each of the series of these agitation mechanisms. This structure then makes for an efficient system to treat large numbers of either semiconductors wafers or modules.

BRIEF DESCRIPTION OF THE DRAWINGS

FIG. 3A illustrates a sectional view of FIG. 3 along line 3—3.

DESCRIPTION OF THE PREFERRED EMBODIMENTS

Figure 1:
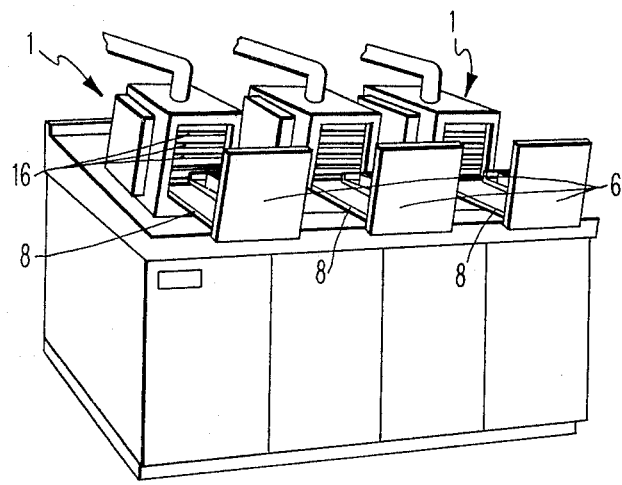
FIG. 1 shows bench mounted module cleaning chambers of one embodiment of the invention.

The equipment may include in one embodiment three bench mounted cleaning chambers, as shown in FIG. 1, each chamber being assigned to one of the three cleaning categories. The three cleaning process categories are:

1. General Cleaning - Removal of general contaminents resulting from storage and handling.
2. Flux cleaning - Removal of flux residues after chip joinings.
3. Pre-encapsulation cleaning - Removal of particulates and moisture.

The fundamental operating principle of the chamber is analogous to the small home dishwasher appliance. It requires an introduction of parts into an enclosure where they remain stationary while the various liquids and gases are introduced in sequential steps. A metered amount of cleaning fluid, liquid or gas, is used for each step and upon completion, drained into a waste reservoir for reclaimation.

Figure 2:
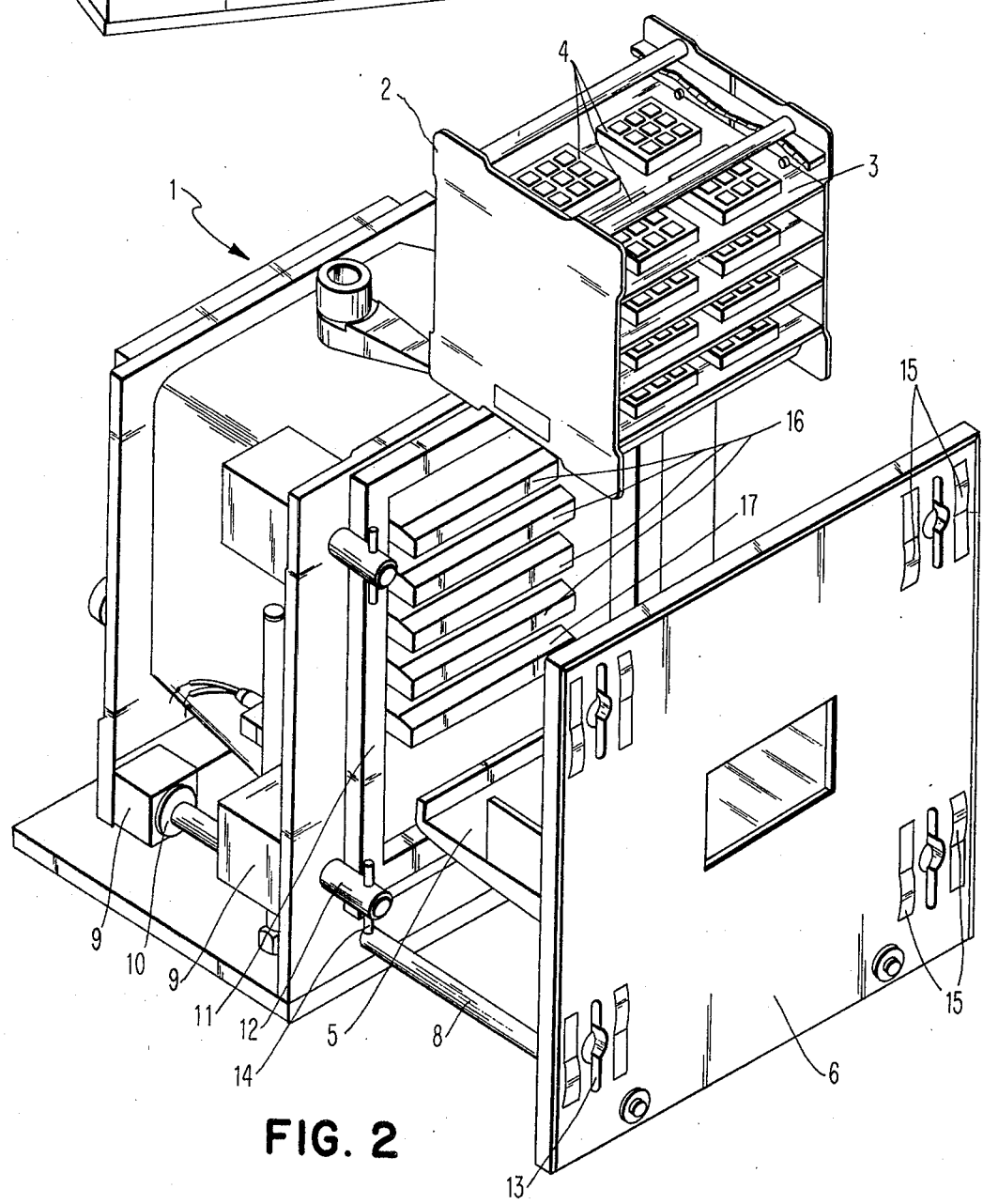
FIG. 2 illustrates a close-up view of a module cleaning chamber with a module carrier outside the chamber.
Figure 3:
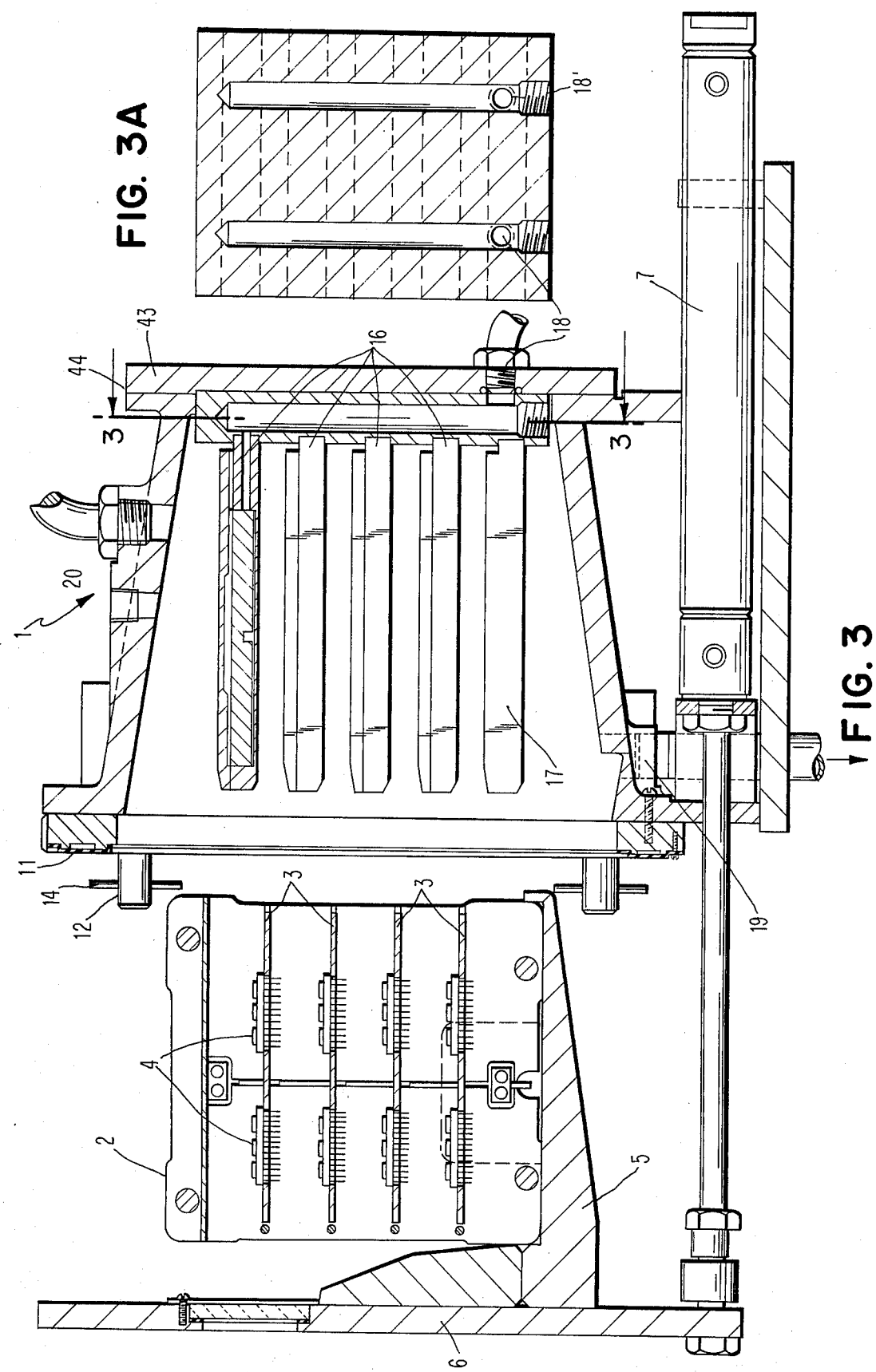
FIG. 3 shows a partially sectioned side view of the fluid application system with the chamber open and the module carrier outside of the agitation mechanisms.

The following description relating to the operation of the module cleaning embodiment may be understood with the help of FIGS. 1, 2 and 3. The modules are introduced into the chamber 1 in batched groups contained in a standard manufacturing carrier 2. Within the carrier are four module pallets 3, spaced apart in a vertical array, each containing a horizontal matrix of modules 4. The carrier 2 is manually placed on a support platform 5 attached to the chamber door 6. A cycle start button is manually depressed. All operations hereon can be automatically sequenced and controlled via a pre-programmed process controller. The chamber door 6 is closed by a two way air cylinder 7, as seen in FIG. 3, the door being supported by two shafts 8, as seen in FIG. 2, each guided by a pair of bearing blocks 9 containing linear ball bushings 10. As the door is closed closed against a compressable seal 11, four door locks 12, one at each corner, pass through their respective slots 13 in the door 6, rotate counterclockwise as the pin 14 bears and wedges the door against the seal 11 resulting from the cumulative force of the pressure angle of the cam insert pairs 15 located at each corner of the door 6. The position of the carrier 2 completely encompasses the four agitation mechanisms 16 and the mass member 17, such that each agitator 16 is above and parallel to the substrate plane established by the four pallets 3. The operation and description of the agitation mechanism 16 is given hereinafter.

Solvent is supplied through input port 18 and out each nozzle plate of the four agitation mechanisms 16, filling the chamber with a premeasured and temperature conditioned solvent. The process engineer has the option of an initial soak step or an initial agitation step or a combination of both, applied intermittently. When the time interval for this process step is completed, the solvent is drained through port 19 into a holding tank for reclaiming. The step can be repeated or spray rinsed through the agitators, or both, or gas dried (nitrogen or air) through the agitator, or any combination the process engineer desires. During gas drying, the chamber is exhausted via port 20. At the completion of the process cycle, the door locks 12 rotate clockwise, aligning the pins 14 with the slots 13 and the double acting cylinder 7 pushes the door open allowing the carrier 2 to be removed.

Figure 4:
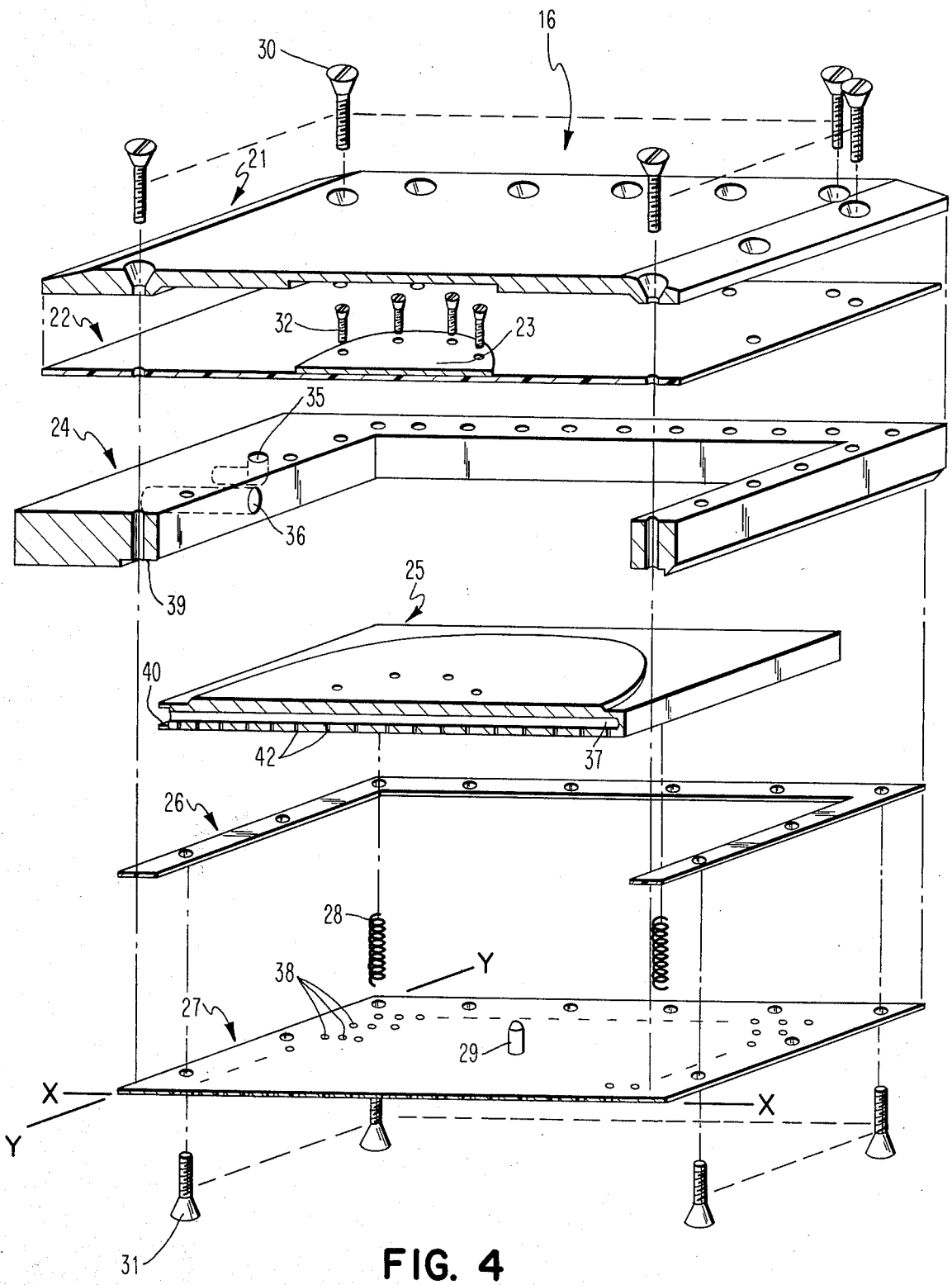
FIG. 4 shows a partial exploded view along its front to back centering of the agitation mechanism.

The agitation mechanism 16 is made up of twelve basic parts. FIG. 4 shows a partial exploded view cut along its front to back centering. The mechamism is assembled as follows. First, the nozzle plate 27 having a square matrix of closely spaced holes 38 and two piston locator pins 29 is mounted and sandwiching an elastomer gasket seal 26 to the countersunk surface 39 of the piston frame 24 fastened in place at its perimeter by screws 31. The square piston 25 having a countersunk slot 40 on one side edge and a series of long parallel holes 37 drilled perpendicular to slot 40 and having the same centering spacing as the rows of holes contained in the nozzle plate 27 along the Y—Y axis. Spray holes 42 are drilled intersecting the long holes 37 and having the same centering spacing as the rows of holes contained in the nozzle plate 27 along the X—X axis. Six blind clearance holes are drilled in the bottom surface of the piston 25. Four of which pocket the four compression springs 28 and the remaining two locate the piston hole matrix to the nozzle plate hole matrix via the two locating pins 29. The square piston 25 is then mounted to the bottom surface of the elastomer diaphram 22 and retained by plate 23 and fastened together with screws 32. The assembly as described is placed on top of the piston frame 24. The piston 25 fits within the square opening of the piston frame 24. The elastomer diaphram 22 rests on top of the piston frame 24 and is sandwiched and held down by the pneumatic chamber plate 21 and fastened together at the perimeter with screws 30. The four agitator mechanisms 16 are mounted to a manifold plate 43, as seen in FIG. 3, which is mounted to the back surface of chamber 1 and sealed with an elastomer gasket 44. The manifold plate 43 permits communication of the solvent and gases input at ports 18 and 18' respectively with the agitator mechanism 16.

Figure 5A:
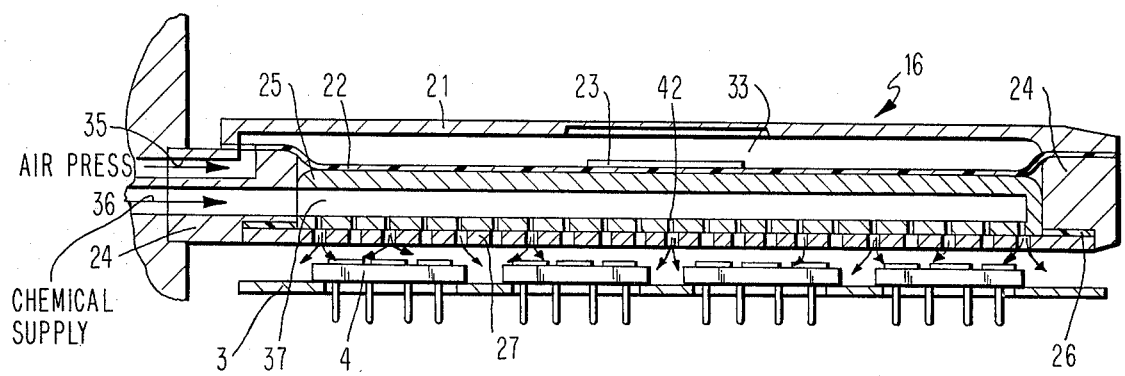
FIGS. 5A, 5B, 5C and 5D illustrate the operation of the agitation mechanism.
Figure 5B:
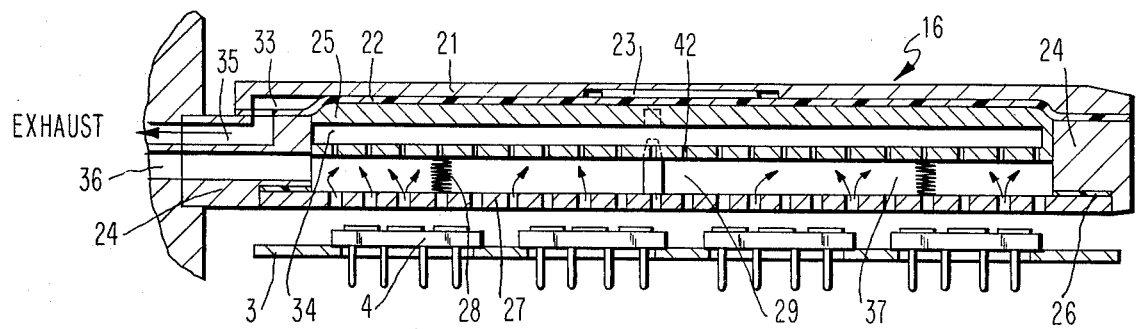

The agitator mechanism 16 which is a form of a diaphram pump is shown in FIGS. 5A. 5B, 5C, and 5D. The pmup has a pneumatic chamber 33 and a fluid chamber 34 separated by an elastomer diaphram 22. It's operation is as follows: The parts to be cleaned, in this case the modules 4 contained in pallets 3 parallel and under the agitator mechanism 16, are all submerged in the cleaning solvent contained in chamber 1, as previously described. The agitation cycle begins when compressed air is allowed through inlet port 35 via port 18' as shown in FIG. 3A. The air pressure forces the diaphram/piston 25 down urging the solvent contained in the fluid chamber 34 through the holes in the nozzle plate 27 thereby impinging by spraying the module surfaces and flushing the dissolved contaminate away. Exhausting the compressed air as shown in FIG. 5B, the four springs 28 having been compressed, restore the piston 25 in the up position pulling in the solvent and filling the fluid chamber 34. The action described is repeated many times during the agitation process step. Frequencies of up to 200 cycles/minute can be obtained. The gauge air pressure can be adjusted permitting either a gentle or forceful agitation cycle as determined by the product being cleaned.

Figure 5C:
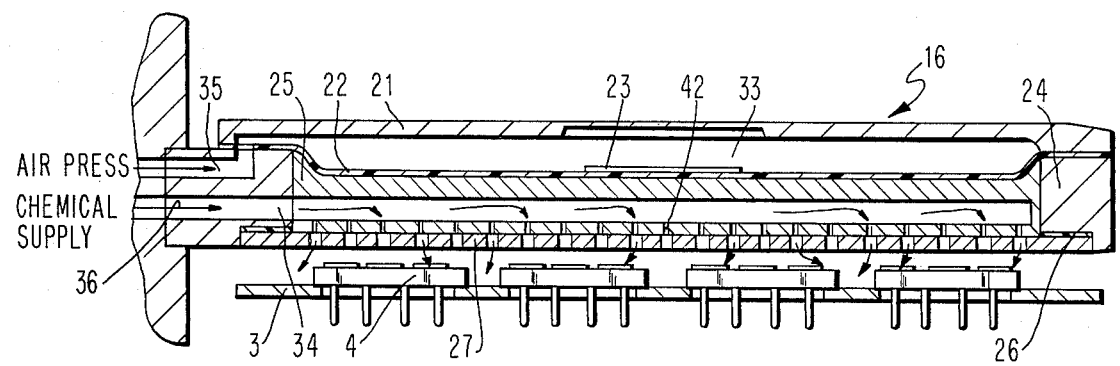

During the solvent spray rinse process step, the solvent is removed from the chamber by draining as described earlier. Compressed air is allowed through inlet port 35, for this purpose a lower pressure, sufficient to depress the four compression springs and allowing the piston 25 to rest on the nozzle plate 27 as shown in FIG. 5C. In this position the chemical supply port 36 of the piston frame 24 is aligned with the distribution slot 40 and holes 37 of the piston 25 permitting solvent to flow under pressure through the circuit described and out the smaller spray holes 42 and through the larger nozzle plate holes 38. The piston 25 having been prealigned with the nozzle plate 27 via the locating pins 29, therefore superimposing the smaller spray holes 42 directly over the larger nozzle plate holes 38. The spray holes 42 are designed such to impede the solvent flow thereby creating a fine spray mist used for rinsing the modules 4. The same procedure is used for filling the chamber 1 with solvent as that described for spray rinsing, however, with the drain 19 in a closed position.

Figure 5D:
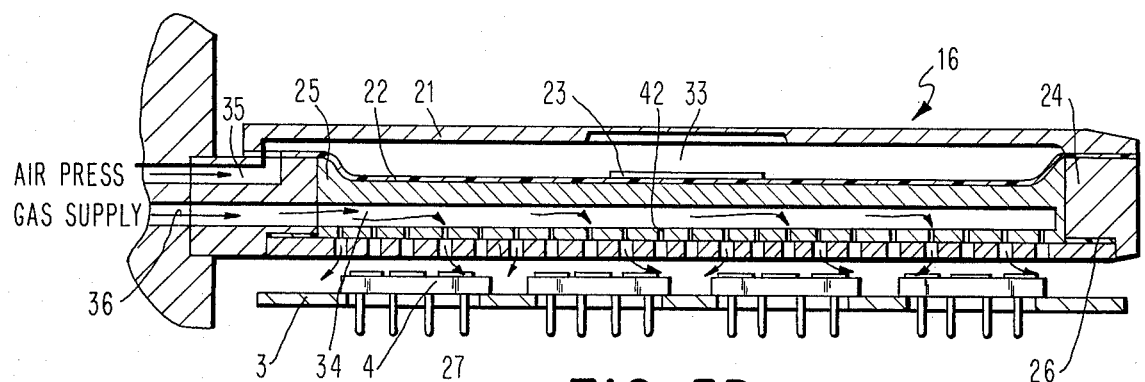

During the gas drying process step, shown in FIG. 5D, heated nitrogen or air is used to purge the solvent and eventually drying the modules 4 using the same procedure defined for spray rinsing. During this time the drain 19 and exhaust port 20 are opened as shown in FIG. 3.

Figure 6:
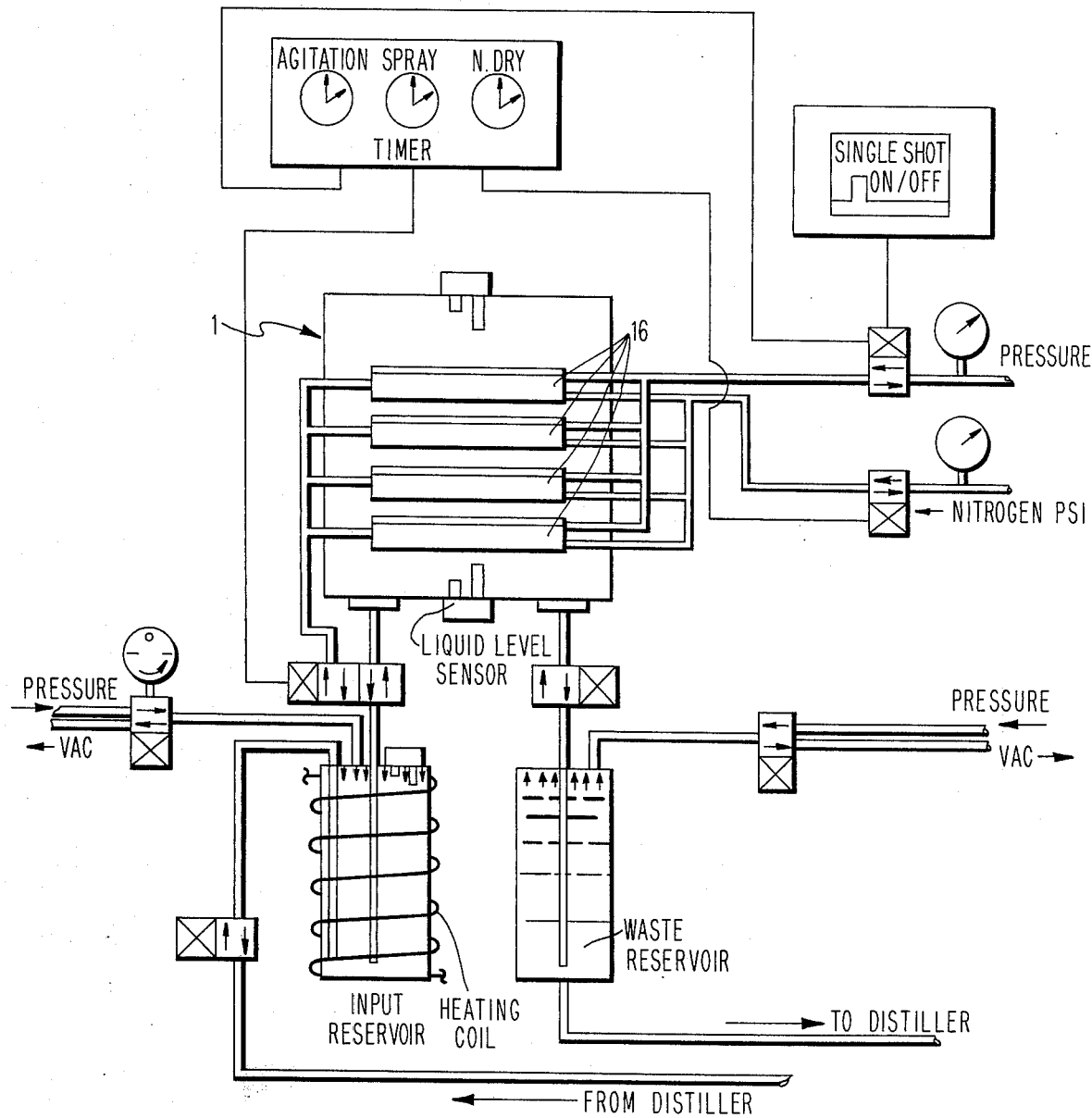
FIG. 6 shows a schematic representation of the electrical and fluid flow connections of the fluid application system shown in FIGS. 1–5D.

FIG. 6 in a self-explanatory manner illustrates the electrical controls for agitation, spray and nitrogen dry of the present fluid application system. The fluid plumbing is also shown therein.

Figure 7:
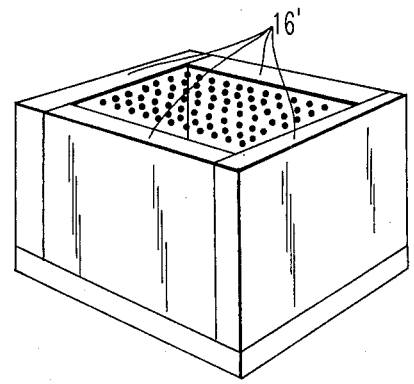
FIG. 7 shows a chamber which is constructed by having each internal surface of the chamber made of an agitator mechanism.

The arrangement of the agitator mechanism can be modified in many ways. Its use is not limited to substrate or module cleaning. It can be applied to photolithographic process, acid etching, etc. for semiconductor wafer processing. An example of its use and arrangements can be best described by reference to FIG. 7 which shows each internal surface of a tank made up of agitator mechanisms 16'.

Figure 8:
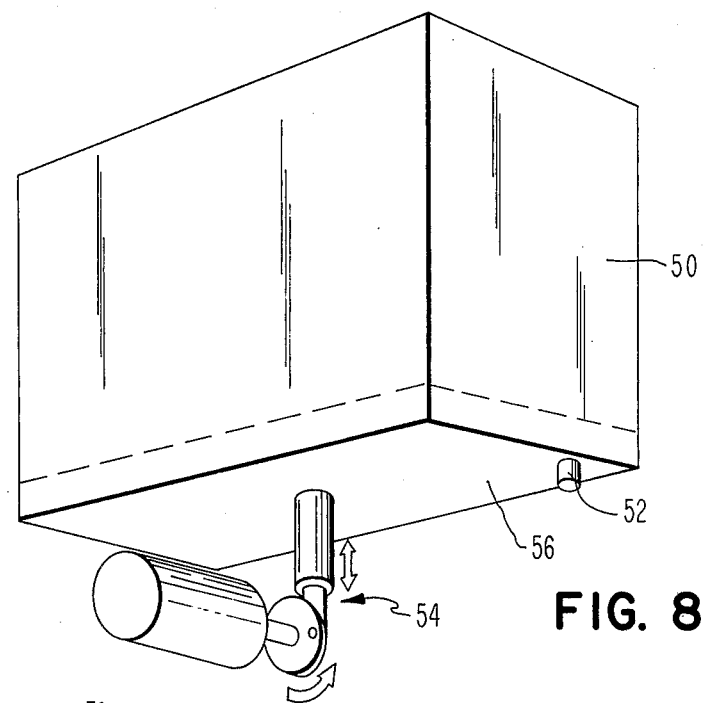
FIG. 8 illustrates schematically a modification of the agitation mechanism.

A further example of a possible modification is shown in FIG. 8 wherein the agitator piston is driven with a mechanical or electrical oscillator. The FIG. 8 shows a chamber 50 to hold the fluid to be agitated, a drain 52 constructed with the frame of the chamber, and a motor driven oscillating means 54 suitably connected to the piston (not shown). In this embodiment the agitation mechanism 56 is in the bottom of the chamber.

Figure 9:
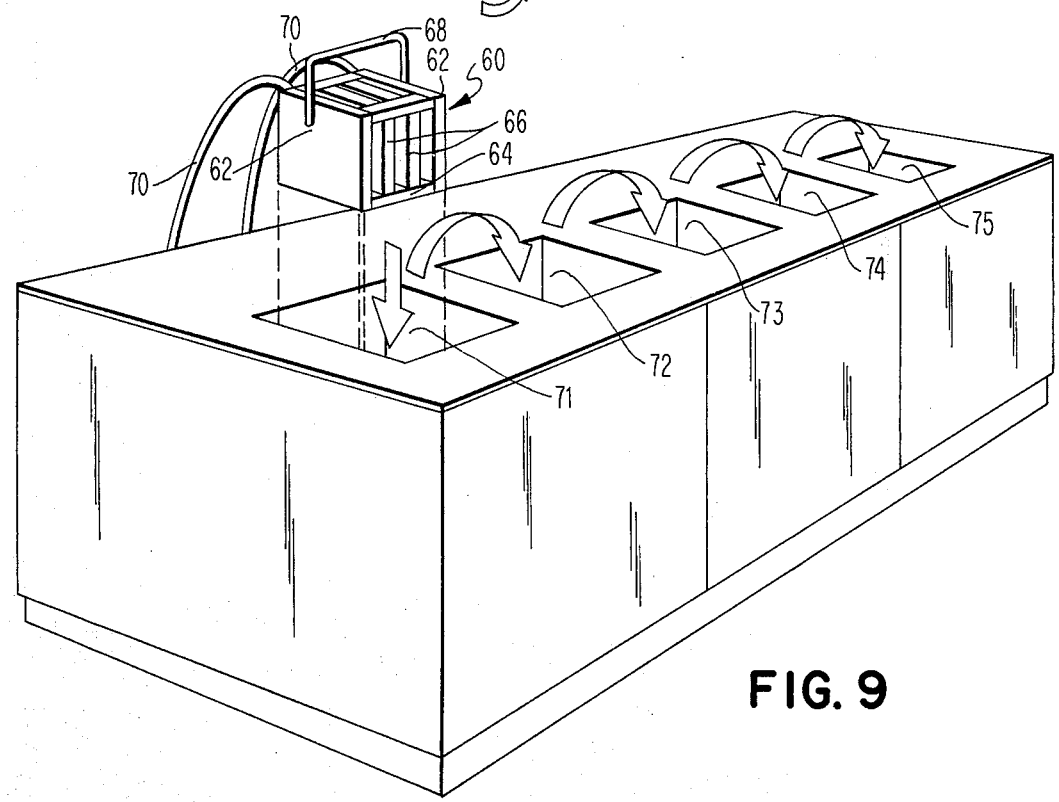
FIG. 9 shows a portable type agitation mechanism.

FIG. 9 shows a portable agitation mechanism unit 60 having two agitation mechanisms 62 and means 64 between the two mechanisms for holding an object or objects 66 to have fluid applied thereto. The mechanisms 62 each have the orificed plate positioned on one side of the object or objects 66 to be subjected to the fluid. A handle 68 allows for easy movement of the unit. Flexible tubes 70 connects the agitation mechanisms to a gas source for activation of the cyclical agitation of the mechanism. The unit 60 can be successively moved through a series of chemical fluid applications, 71, 72, 73, 74 and 75. For example, in a photoresist developing process (after light exposure), the chambers could contain the following 71 — an alkaline solution pH 7, 72 — deionized water, 73 — alkaline solution, 74 — deionized water and 75 — dry-nitrogen gas. In chemical etching or machining the chambers could contain 71 — acid or alkaline solution, 72 — deionized water immersion agitated, and 73 — deionized water sprayed.

While the invention has been particularly shown and described with reference to the preferred embodiments thereof, it will be understood by those skilled in the art that various changes in form and details may be made therein without departing from the spirit and scope of the invention.

What is claimed is:

1. Apparatus for fluid application to a plurality of substantially planar objects comprising:
   carriers for said planar objects;
   means for supporting said carriers in a vertical array attached to the door of said apparatus;
   a chamber having a like number of agitation mechanisms to the number of said carriers;
   said agitation mechanisms being positioned in said chamber in a vertical array so that when said door is closed said agitation mechanisms fit interleaved to, and above and parallel to the plane of said carriers;
   each of said mechanisms include an orificed plate positioned on one side of each of said carriers; and
   means for moving fluid through said orificed plate with a pulsating motion.

2. Apparatus of claim 1 and further comprising:
   means for rinsing said objects, and
   means for drying said objects wherein said means for moving, rinsing and drying are a part of said mechanism.

3. Apparatus for cleaning a plurality of modules carrying semiconductor devices comprising:
   carriers for said modules;
   means for supporting said carriers in a vertical array attached to the door of said apparatus;
   a chamber having a like number of agitation mechanisms to the number of said carriers;
   said agitation mechanisms being positioned in said chamber in a vertical array so that when said door is closed said agitation mechanisms fit interleaved to, and above and parallel to the plane of said carriers;
   each of said mechanisms include an orificed plate positioned on one side of each of said carriers;
   means for moving fluid through said orificed plate with a pulsating motion for cleaning said modules;
   means for spray rinsing said modules; and
   means for gas drying said modules.

4. The apparatus of claim 3 wherein said semiconductor devices are attached to said module with their contacts down and said orificed plate is closely adjacent to said module so that the said fluid is forced under and around said contacts between said devices and said module to clean material from this area.

5. The apparatus of claim 1 wherein said agitation mechanism includes:
   a pneumatic chamber;
   a fluid chamber;
   a flexible diaphram separating said fluid and pneumatic chambers;
   a piston movable in a piston frame within said fluid chamber so as to be contiguous to a surface of said diaphram;
   a plate forming a side of the said fluid chamber with a plurality of openings for movement of fluid;
   an inlet port to said pneumatic chamber for providing pressure differentials within said pneumatic chamber which causes the movement of said piston and in turn the cyclical movement of fluids through said openings; and
   spring means connected between said piston and said plate which means are compressed at the end of the cycle of exhausting the fluid from said fluid chamber and fully extended at the end of the fluid filling cycle of said fluid chamber.

6. The apparatus of claim 1 wherein the said agitation mechanism further includes the said piston being hollow with a plurality of ports which communicate with said openings being adapted in its movement to connect with an inlet-outlet port on one side edge of said piston wherein fluids forced through said inlet-outlet port into the said piston and through said openings in to a container filled with fluid for spraying and drying purposes.

* * * * *